(12) United States Patent
Chen et al.

(10) Patent No.: US 9,356,102 B2
(45) Date of Patent: May 31, 2016

(54) DOUBLE STEPPED SEMICONDUCTOR SUBSTRATE

(71) Applicant: Taiwan Semiconductor Manufacturing Company, Ltd., Hsin-Chu (TW)

(72) Inventors: Meng-Ku Chen, New Taipei (TW); Hung-Ta Lin, Hsinchu (TW); Huicheng Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/809,813

(22) Filed: Jul. 27, 2015

(65) Prior Publication Data

US 2015/0333129 A1    Nov. 19, 2015

Related U.S. Application Data

(62) Division of application No. 13/756,412, filed on Jan. 31, 2013, now Pat. No. 9,099,311.

(51) Int. Cl.
*H01L 29/267* (2006.01)
*H01L 29/06* (2006.01)
*H01L 21/324* (2006.01)
*H01L 21/02* (2006.01)
*H01L 21/306* (2006.01)

(52) U.S. Cl.
CPC .......... *H01L 29/267* (2013.01); *H01L 21/0243* (2013.01); *H01L 21/0262* (2013.01); *H01L 21/02381* (2013.01); *H01L 21/02538* (2013.01); *H01L 21/02546* (2013.01); *H01L 21/02639* (2013.01); *H01L 21/02658* (2013.01); *H01L 21/30604* (2013.01); *H01L 21/324* (2013.01); *H01L 29/0692* (2013.01)

(58) Field of Classification Search
CPC ..................... H01L 21/02381; H01L 21/0243; H01L 21/02538; H01L 21/02546; H01L 21/0262; H01L 21/30604; H01L 21/324; H01L 21/02639; H01L 21/02658; H01L 29/267; H01L 29/0692
See application file for complete search history.

(56) References Cited

U.S. PATENT DOCUMENTS

2011/0306179 A1    12/2011   Wann et al.
2014/0209974 A1    7/2014    Chen et al.

*Primary Examiner* — Whitney T Moore
(74) *Attorney, Agent, or Firm* — Haynes and Boone, LLP

(57) ABSTRACT

A method for forming a double step surface on a semiconductor substrate includes, with an etching process used in a Metal-Organic Chemical Vapor Deposition (MOCVD) process, forming a rough surface on a region of a semiconductor substrate. The method further includes, with an annealing process used in the MOCVD process, forming double stepped surface on the region of the semiconductor substrate.

20 Claims, 4 Drawing Sheets

DOUBLE STEPPED SEMICONDUCTOR SUBSTRATE

PRIORITY DATA

The present application is a divisional application of U.S. application Ser. No. 13/756,412, filed Jan. 31, 2013, which is incorporated herein by reference in its entirety.

BACKGROUND

Semiconductor fabrication often involves the formation of multiple semiconductor layers on top of each other. In some cases, different types of semiconductor materials may be used for different layers. For example, a type III-V semiconductor material may be formed on top of a type IV semiconductor material.

The crystal lattice of a type III-V semiconductor alternates between a type III element and a type V element, for example, gallium and arsenic respectively. It is desirable that this pattern remain consistent throughout the crystal. During epitaxial processes which are used to grow a type III-V semiconductor, certain defects may occur. Particularly, Anti-Phase Boundary (APB) defects can occur which can adversely affect the performance of circuits formed within the semiconductor layer. Therefore, it is desired to have methods of fabrication that reduce or eliminate the formation of such defects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
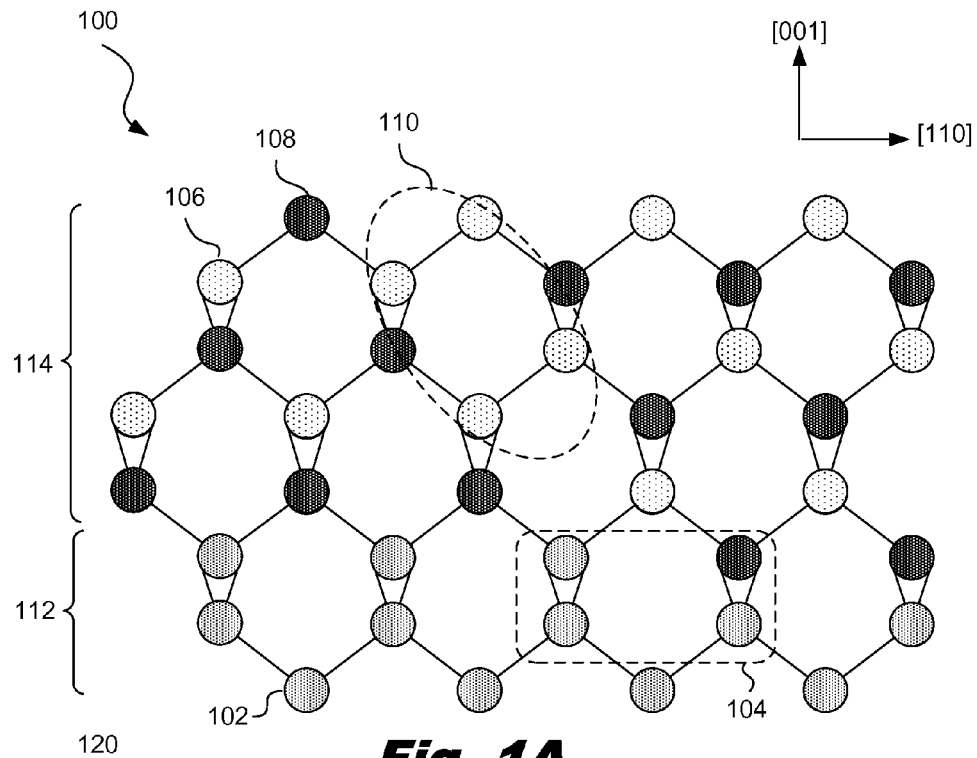
FIG. 1A is a diagram showing an illustrative defect in the crystal lattice of a type III-V semiconductor grown on a type IV semiconductor, according to one example of principles described herein.

FIG. 1A is a diagram 100 showing an illustrative defect in the crystal lattice of a type III-V semiconductor grown on a type IV semiconductor. In this example, the type IV semiconductor layer 112 is made of silicon (Si) atoms 102. Additionally, the type III-V semiconductor layer 114 is made of gallium (Ga) 106 and arsenic (As) 108. The type III-V semiconductor layer 114 forms a pattern that alternates between Ga 106 atoms and As atoms 108. It is desirable that this pattern have translational symmetry. That is, the pattern should look the same throughout the crystal.

When forming a III-V semiconductor onto a type IV semiconductor, a pre-layer may be used. The pre-layer may be made from a type V semiconductor. For example, when growing GaAs on Si, a pre-layer made of As may be formed on top of the type IV semiconductor layer. This can be done from the As source that is contained within the MOCVD chamber. This prelayer helps to reduce APB on either single or double step surfaces.

In the example of FIG. 1A, the surface of the type IV layer 112 is a single step 104. That is, there is a one lattice point difference between the two levels. When using an epitaxial process to grow a type III-V semiconductor layer on top of a single step type IV layer 112, an anti-phase boundary defect 110 may occur. As illustrated, the gallium atoms 106 are adjacent to each other where they should not be. This affects the pattern throughout the crystal. The APB defect may have an adverse effect on the performance of a device embodying the defective semiconductor material.

Figure 1B:
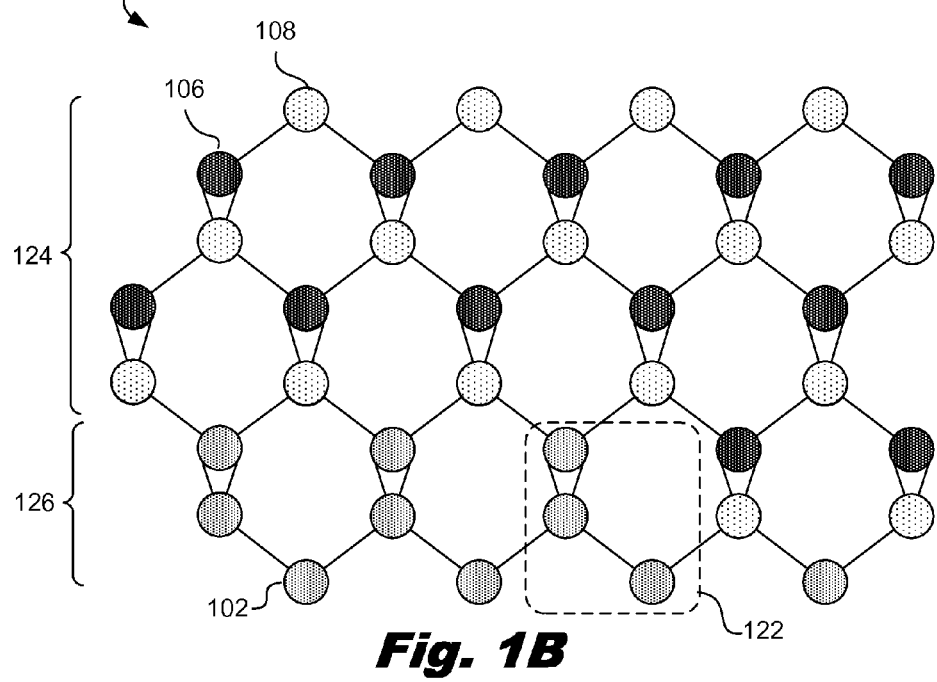
FIG. 1B is a diagram showing an illustrative APB free crystal lattice of a type III-V semiconductor grown on a type IV semiconductor, according to one example of principles described herein.

FIG. 1B is a diagram 120 showing an illustrative APB free crystal lattice of a type III-V semiconductor grown on a type IV semiconductor. APB defects can be significantly reduced or eliminated by using a double stepped surface 122 on the type IV semiconductor layer 112. The double stepped surface 122 is referred to as such because there is a two lattice point difference between the two levels. The double stepped surface 122 helps ensure that the crystal lattice of the type III-V semiconductor layer 124 is formed with the proper patterning during the epitaxial process.

The view illustrated in FIGS. 1A and 1B are along the axis as indicated in the axis diagram 128. Specifically, the vertical direction of FIGS. 1A and 1B corresponds with the [0,0,1] axis. Additionally, the horizontal direction of FIGS. 1A and 1B corresponds to the [0,1,1] axis. The axes referred to correspond to conventional methods for describing crystal structures.

Figure 2A:
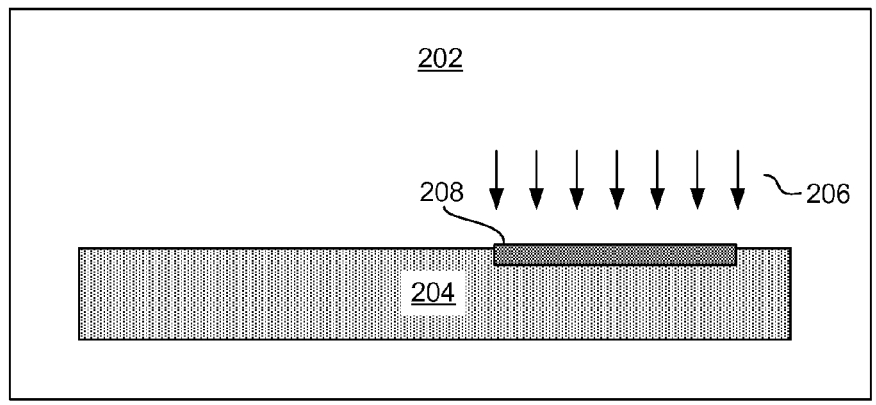
FIGS. 2A-2C are diagrams showing an illustrative process for forming a double stepped semiconductor substrate in situ with an epitaxial process, according to one example of principles described herein.
Figure 2B:
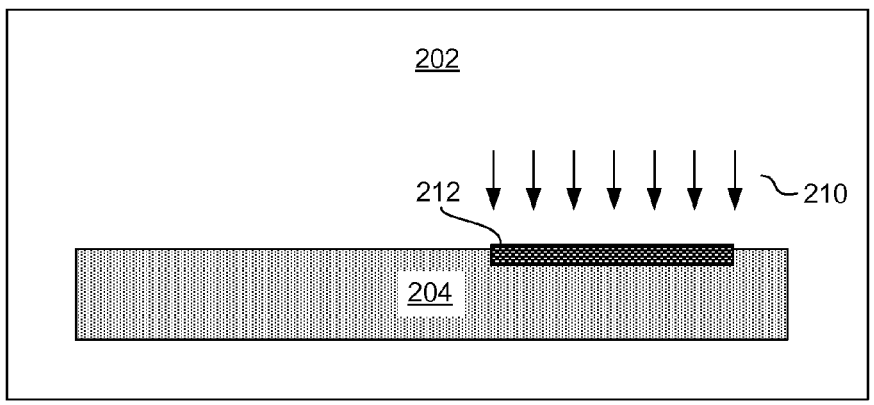
Figure 2C:
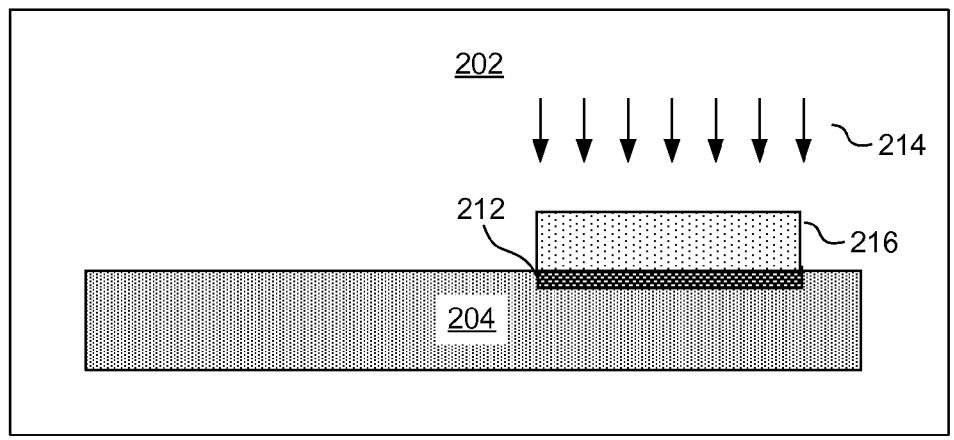

FIGS. 2A-2C are diagrams showing an illustrative process for forming a double stepped semiconductor substrate in situ with an epitaxial process. Double stepped surfaces may be formed through certain processes which are typically performed with specific equipment. According to principles described herein, the formation of double steps is done through processes with which the epitaxial growing chamber is equipped to handle. For example, processes used within a Metal-Organic Chemical Vapor Deposition Chamber (MOCVD) can be used to form the double stepped surface in situ with the epitaxial growing process.

FIG. 2A illustrates a semiconductor substrate 204 within an epitaxial growing chamber 202. In one example, the substrate is a type IV semiconductor such as silicon. In one example, the epitaxial growing chamber is a MOCVD chamber 202. MOCVD involves the injection of ultra pure gases into a reactor. These gases are such that a very thin layer of atoms is deposited, or grown, onto a semiconductor substrate. This growth occurs as a result of surface reaction of organic compounds or metal-organics and hydrides containing the appropriate chemical elements.

According to certain illustrative examples, an etching process 206 used in the epitaxial growing process is used to form a rough or off-cut region 208 on the semiconductor substrate 204. In the case of an MOCVD chamber 202, the etching process may be a Hydrogen Chloride (HCl) etching process. The MOCVD chamber is already equipped to perform such an etching process 206 and thus the etching process used to form the rough surface region 208 can be done in situ.

FIG. 2B illustrates a thermal annealing process used to form the double stepped region 212 within the rough surface region 208. Again, the thermal annealing process is used with the MOCVD process and thus it may be done in situ. A thermal annealing process is one that is used in semiconductor fabrication, particularly, in chemical vapor deposition processes. The thermal annealing process heats the semiconductor wafer to a high temperature ranging between 800 and 1,200 degrees Celsius. The thermal energy creates favorable conditions for the double step formation on the surface of the semiconductor substrate. The double steps can be formed along a desired axis, in other words, on-axis. For example, the formation of double steps on-axis may be along the [0,1,1] axis.

FIG. 2C illustrates the formation of a second semiconductor layer 216 on top of the double stepped surface 212. In one example, the second semiconductor layer 216 is made of a type III-V semiconductor material, such as gallium arsenic (GaAs). The formation of the second semiconductor layer 216 is done through the epitaxial growing process for which the chamber 202 is designed. For example, if the chamber 202 is a MOCVD chamber, then an MOCVD process 214 is used to form the second semiconductor layer 216.

According to certain illustrative examples, the formation of the double stepped surface may be formed at locations where a second semiconductor layer will be deposited. Thus, instead of forming double stepped regions over the entire substrate 204, it is only formed where it will be useful for creating APB free type III-V layers on top of the substrate 204. Additionally, because the formation of the double stepped surfaces are formed in the same chamber 202 in situ with the epitaxial growing process, fabrication can occur more efficiently. Specifically, the substrate 204 does not first have to be loaded into a separate chamber used specifically for forming double stepped surfaces.

Figure 3:
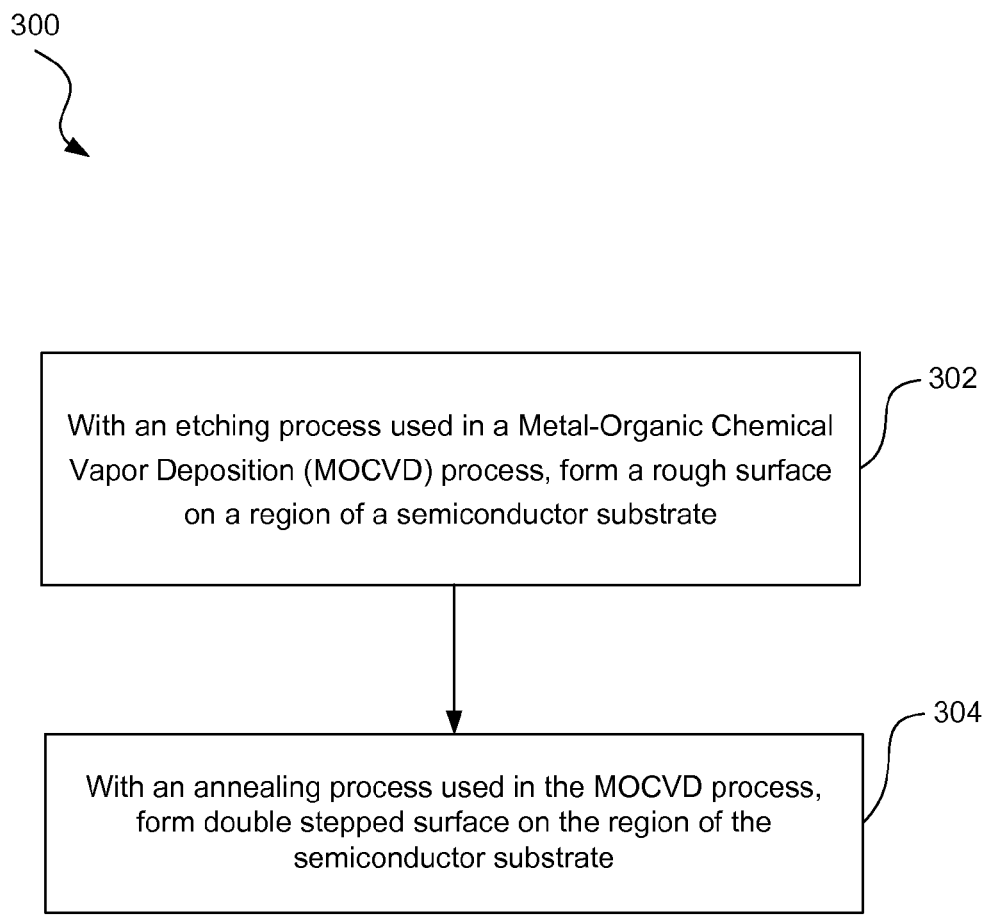
FIG. 3 is a flowchart showing an illustrative method for forming a double stepped semiconductor substrate in situ with an epitaxial process, according to one example of principles described herein.

FIG. 3 is a flowchart showing an illustrative method for forming a double stepped semiconductor substrate in situ with an epitaxial process. According to certain illustrative examples, the method includes a step of, with an etching process used in a MOCVD process, forming (302) a rough surface on a region of a semiconductor substrate. The method further includes a step of, with an annealing process used in the MOCVD process, forming (304) double stepped surface on the region of the semiconductor substrate.

According to certain illustrative examples, a method for forming a double step surface on a semiconductor substrate includes, with an etching process used in a MOCVD process, forming a rough surface on a region of a semiconductor substrate. The method further includes, with an annealing process used in the MOCVD process, forming double stepped surface on the region of the semiconductor substrate.

A semiconductor substrate includes an off-cut region formed through an etching process used in a MOCVD process. The substrate further includes a double stepped region formed within the off-cut region, the double stepped region being formed through an annealing process used in the MOCVD process and in the same chamber as the MOCVD process.

A method for forming a double step surface on a semiconductor substrate includes, with a Hydrogen Chloride (HCl) etching process used in a MOCVD process, forming an off-cut surface on a region of a semiconductor substrate. The method further includes, with an annealing process used in the MOCVD process, forming double stepped surface on the region of the semiconductor substrate. The method further includes forming a III-V semiconductor layer onto the double stepped region with the MOCVD process. The double stepped region is such that there are fewer anti-phase boundary (APB) defects formed into the III-V semiconductor layer.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
   a group IV semiconductor material layer having a double stepped surface, wherein a first component of the group IV semiconductor material is double bonded to a second component of the group IV semiconductor material; and
   a group III-V semiconductor material layer disposed directly on the double stepped surface, wherein the group III-V semiconductor material layer includes a group III semiconductor material and a group V semiconductor, wherein the group III semiconductor material is doubled bonded to the group V semiconductor material, wherein the double stepped surface is free of the group IV semiconductor material being double bonded to the group V semiconductor material.

2. The device of claim 1, wherein the group IV semiconductor material includes Si.

3. The device of claim 1, wherein the first component of the group IV semiconductor material includes Si, and
wherein the second component of the group IV semiconductor material includes Si.

4. The device of claim 1, wherein the group III semiconductor material includes Ga and the group V semiconductor material includes As.

5. The device of claim 1, wherein the double stepped surface is positioned within an off-cut region of the group IV semiconductor material layer.

6. The device of claim 1, wherein the double stepped surface does not cover the entire group IV semiconductor material layer.

7. The device of claim 1, wherein the double stepped surface is free of anti-phase boundary (APB) defects.

8. A semiconductor substrate comprising:
an off-cut region formed through an etching process used in a Metal-Organic Chemical Vapor Deposition (MOCVD) process; and
a double stepped surface formed within the off-cut region, the double stepped surface being formed through an annealing process used in the MOCVD process and in the same chamber as the MOCVD process.

9. The semiconductor substrate of claim 8, further comprising a group III-V semiconductor material layer disposed directly on the double stepped surface, wherein the group III-V semiconductor material layer includes a group III semiconductor material and a group V semiconductor, and
wherein the semiconductor substrate includes a group IV semiconductor material layer, and
wherein a first component of the group IV semiconductor material is double bonded to a second component of the group IV semiconductor material, and
wherein the group III semiconductor material is doubled bonded to the group V semiconductor material, wherein the double stepped surface is free of the group IV semiconductor material being double bonded to the group V semiconductor material.

10. The semiconductor substrate of claim 9, wherein the first component of the group IV semiconductor material includes Si, and
wherein the second component of the group IV semiconductor material includes Si.

11. The semiconductor substrate of claim 10, wherein the group III semiconductor material includes Ga and the group V semiconductor material includes As.

12. The semiconductor substrate of claim 9, wherein the double stepped surface does not extend across the entire group IV semiconductor material layer.

13. The semiconductor substrate of claim 9, wherein the group III-V semiconductor material only covers a portion of the group IV semiconductor material layer.

14. The semiconductor substrate of claim 8, wherein the double stepped surface is free of anti-phase boundary (APB) defects.

15. A method for forming a double step surface on a semiconductor substrate, the method comprising:
with a Hydrogen Chloride (HCl) etching process used in situ with a Metal-Organic Chemical Vapor Deposition (MOCVD) process, forming an off-cut surface on a region of a semiconductor substrate;
with an annealing process used in situ with the MOCVD process, forming double stepped surface on the region of the semiconductor substrate; and
forming a III-V semiconductor layer onto the double stepped region with the MOCVD process;
wherein the double stepped region is such that there are fewer anti-phase boundary (APB) defects formed into the III-V semiconductor layer.

16. The method of claim 15, wherein the semiconductor substrate is a IV semiconductor.

17. The method of claim 15, wherein the double stepped surface is formed on-axis.

18. The method of claim 15, wherein the formation of the double stepped surface is performed in the same chamber as an MOCVD process.

19. The method of claim 15, wherein the formation of the double stepped surface is in situ with an MOCVD process.

20. The method of claim 15, wherein the annealing process occurs at a temperature of about 1200° C.

* * * * *